United States Patent [19]

Sandhu et al.

[11] Patent Number: 5,156,987
[45] Date of Patent: Oct. 20, 1992

[54] HIGH PERFORMANCE THIN FILM TRANSISTOR (TFT) BY SOLID PHASE EPITAXIAL REGROWTH

[75] Inventors: Gurtej S. Sandhu; Pierre Fazan, both of Boise, Id.

[73] Assignee: Micron Technology, Inc., Boise, Id.

[21] Appl. No.: 812,234

[22] Filed: Dec. 18, 1991

[51] Int. Cl.$^5$ .......................................... H01L 21/265
[52] U.S. Cl. ........................................ 437/40; 437/41; 437/52; 437/247; 437/915; 148/DIG. 109
[58] Field of Search ................ 437/40, 41, 42, 44, 437/56, 47, 52, 247, 915, 233, 60, 918; 148/DIG. 109

[56] References Cited

U.S. PATENT DOCUMENTS

| | | | |
|---|---|---|---|
| 4,902,637 | 2/1990 | Kondou et al. | 437/915 |
| 5,008,212 | 4/1991 | Chen | 437/52 |
| 5,022,958 | 6/1991 | Favreau et al. | 437/40 |
| 5,026,663 | 6/1991 | Zdebel et al. | 437/233 |
| 5,100,817 | 3/1992 | Cederbaum et al. | 437/52 |
| 5,112,765 | 5/1992 | Cederbaum et al. | 437/57 |
| 5,122,476 | 6/1992 | Fazan et al. | 437/52 |

FOREIGN PATENT DOCUMENTS 0045970  2/1990  Japan .................................. 437/247

OTHER PUBLICATIONS

"A High-Performance Stacked-CMOS SRAM Cell by Solid Phase Growth Technique" by Y. Uemoto et al., pp. 21-22, IEEE (1990).

Primary Examiner—Brian E. Hearn
Assistant Examiner—Michael Trinh
Attorney, Agent, or Firm—David J. Paul

[57] ABSTRACT

The present invention introduces a method to fabricate an active PMOS thin film transistor (or p-ch TFT) having an epitaxially grown channel region for high performance operation characteristics. Typically this p-ch TFT device would be fabricated overlying an NMOS active device, thereby becoming an active load (or pullup) to an NMOS device used is such applications as creating a memory cell in static random access memories (SRAMs). Conductivity types (p-type or n-type) may be interchanged to construct an n-ch TFT coupled with a PMOS active device if so desired. The fabrication of the TFT of the present invention may be used to form a CMOS inverter or simply an active pullup device when integrated into conventional CMOS fabrication processes.

10 Claims, 3 Drawing Sheets

HIGH PERFORMANCE THIN FILM TRANSISTOR (TFT) BY SOLID PHASE EPITAXIAL REGROWTH

FIELD OF THE INVENTION

This invention relates to semiconductor devices and more particularly a thin film transistor structure and a process to create same. The thin film transistor structure may be used as an active load in integrated circuit devices, such as Static Random Access Memories (SRAMs).

BACKGROUND OF THE INVENTION

One of the common elements required in electrical circuit devices is the simple pullup (or pulldown device) from an active device to one of the power supply buses. The pullup is simple if used to construct a circuit using discrete components in that all that is required is selecting a resistor of the desired resistance and tolerance, connecting it between an active device, such as an open collector transistor, and $V_{CC}$ and the transistor's output would be pulled up to $V_{CC}$ once the transistor is forward biased. With the advent of the integrated circuit (IC) however, fabricating a resistance onto a wafer substrate, such as silicon or gallium arsenide, takes special consideration particularly when resistivity and tolerances play an important part in circuit operation.

For example, as SRAMs have evolved from the small 4Kb memory arrays to more densely packed array sizes, tolerances of pullup resistances (or pullup loads) had to be tightly controlled. In order to minimize standby current many fabrication processes adopted using an active device as the pullup. In CMOS fabrication it is common to see a PMOS transistor acting an active load device, by providing a current path between a memory cell access transistor and the power supply bus. In this manner the PMOS transistor could be gated on only when the desired line was to be pulled to $V_{CC}$ and turned off otherwise, thereby virtually eliminating leakage current and minimizing standby current for the SRAM device as a whole.

Ongoing efforts to improve active loads has brought about the development of thin film transistors (TFTs) in attempts to provide low leakage current as well as high noise immunity. In a article entitled "A High-Performance Stacked-CMOS SRAM Cell by Solid Phase Growth Technique", pp. 21–22, 1990 Symposium on VLSI Technology, by Y. Uemoto et. al., such a TFT device is disclosed. This article presents a high performance stacked-CMOS SRAM cell with improved polysilicon p-ch TFT load-characteristics that is attained by enlarging the grain size of the polysilicon film for the active region of the p-ch TFT by a solid phase growth (SPG) technique. Basically the grain size of the polysilicon film is controlled by the deposition temperature and the surface roughness is controlled by using ion-implantation for forming the gate for the p-ch TFT instead of by thermal diffusion.

The present invention introduces a TFT having an epitaxially regrown silicon channel region by using a method which provides a solid phase epitaxial regrowth of silicon in a thin film of amorphous silicon for the TFT by using the silicon substrate as a seed.

SUMMARY OF THE INVENTION

The invention is directed to a process to fabricate an active TFT load having an epitaxially regrown silicon channel for use in an integrated circuit, such as an SRAM. The TFT having its silicon channel regrown into a thin layer of amorphous silicon from the silicon seed of an underlying transistor may be used as an active load for an inverter in integrated circuits and more specifically a p-ch TFT coupled to an NMOS device serves as a building block to create memory static memory cells in integrated circuits such as in SRAM devices. The silicon channel of the TFT comprises a thin film of deposited amorphous silicon and a thin film of regrown single crystal silicon (epitaxial silicon) thereby providing better electrical characteristics, such as low leakage current and higher carrier mobility, better fabrication yields and higher reliability, thus making it highly attractive for use in SRAM production.

Standard NMOS transistors are formed in a starting substrate. A TFT gate poly is deposited and patterned followed by oxide contact definition and the deposition of a thin film of amorphous silicon. Next, a thin layer of epitaxially grown silicon is caused to form throughout the thin amorphous layer of poly using the silicon substrate as a seed. The epitaxial regrowth starts at the silicon substrate where the source/drain regions of the NMOS transistor has been formed to complete the TFT.

DETAILED DESCRIPTION OF THE PREFERRED EMBODIMENT

A preferred embodiment of the present invention is directed to a process for fabricating an active PMOS TFT overlying an active NMOS device.

The present invention, for sake of illustration, integrates the process steps depicted in FIGS. 1–6 into a conventional SRAM fabrication process to form a CMOS inverter using the TFT device as an active load. Such a process to fabricate the CMOS inverter may easily be incorporated into other CMOS processes.

Figure 1:
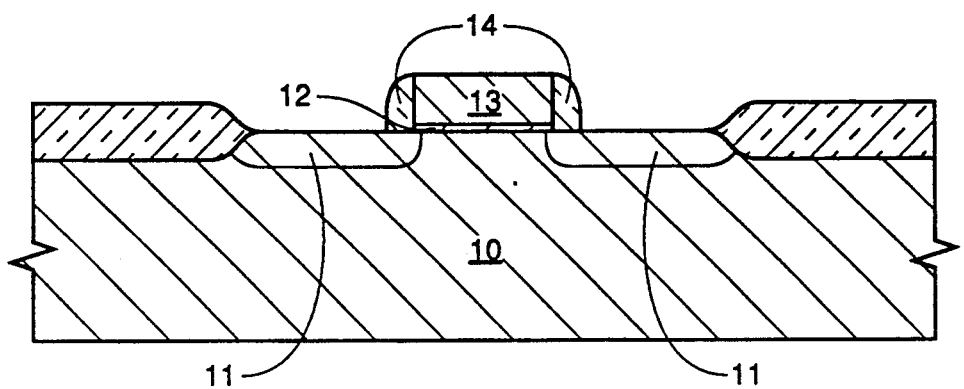
FIG. 1 is a composite cross-sectional view of an in-process wafer portion after formation of a standard NMOS transistor.

As shown in FIG. 1, a starting silicon substrate 10, is fabricated using conventional process steps, known to one skilled in the art, up to the point of having formed an NMOS active device comprising n-type source/drain regions 11 formed on either side of NMOS gate poly 13 overlying gate oxide 12. Dielectric spacers 14 are then created to isolate gate poly 13 and gate oxide 12 on the sidewalls of the NMOS device.

Figure 2:
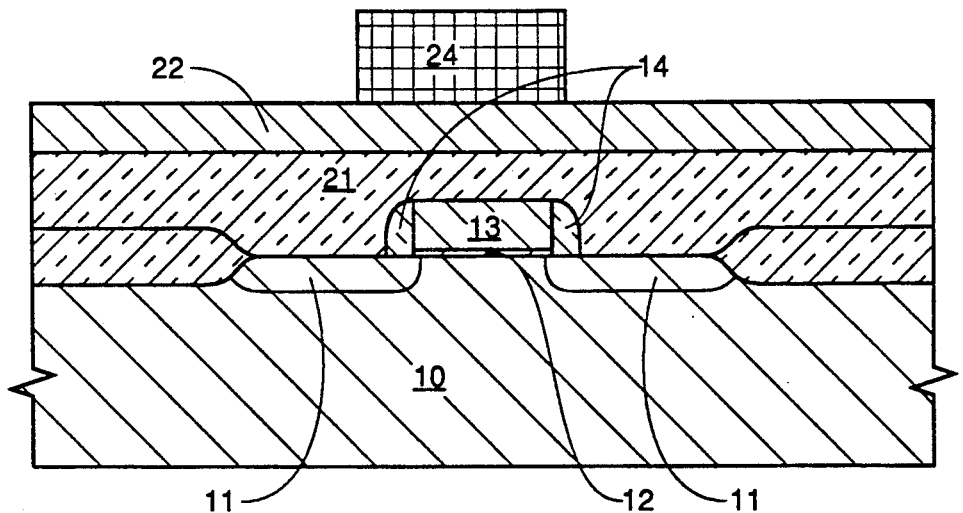
FIG. 2 shows a cross-sectional view of the inprocess wafer portion of Figure after formation and planarization of oxide and deposition of the TFT gate oxide and gate poly.

Referring now to FIG. 2, oxide layer 21 is formed and planarized. Next polysilicon 22 is deposited and doped as p-type conductivity followed by patterning of photoresist 24. Photoresist 24 is used to define the gate of a TFT.

Figure 3:
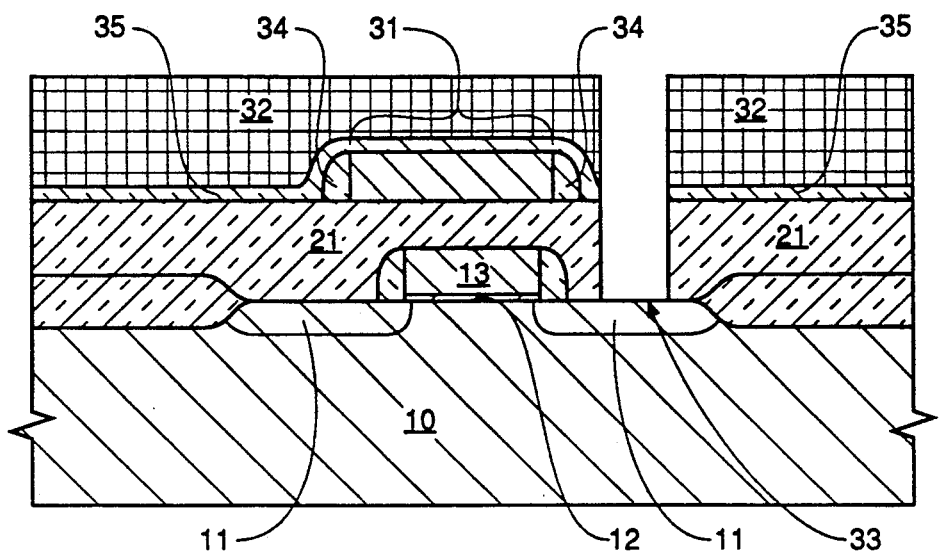
FIG. 3 shows a cross-sectional view of the inprocess wafer portion of FIG. 2 after opening a buried contact location thereby allowing access to the silicon substrate.

Referring now to FIG. 3, poly 22 is patterned by a subsequent etch to form TFT gate 31. Photoresist 24 (seen in FIG. 2) has been stripped and is followed by the formation of oxide spacers 34, followed by LPCVD deposition of gate oxide 35. Then, photoresist 32 is patterned to provide for a subsequent etch to open buried contact location 33. Buried contact opening 33 now allows access to silicon substrate 10 via diffusion region 11 of the NMOS device.

Figure 4:
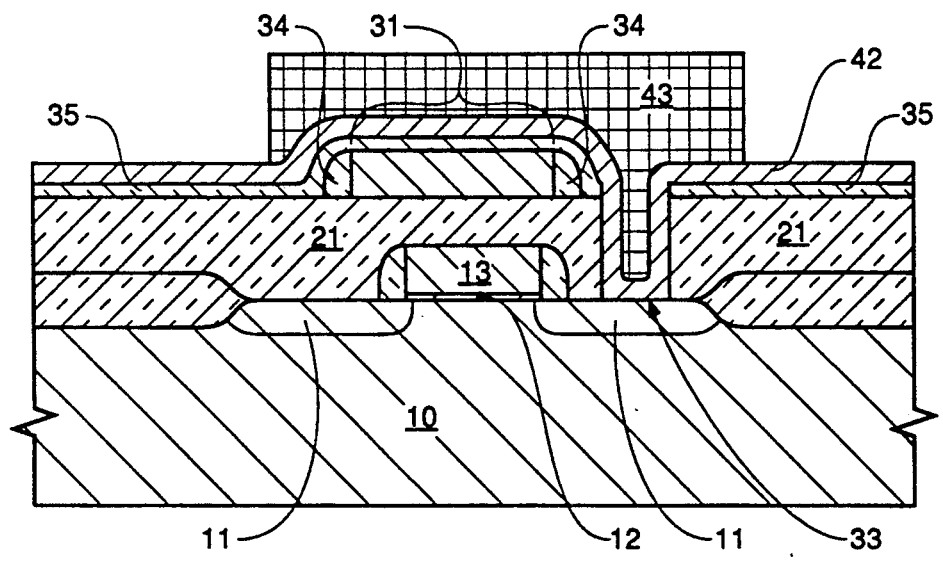
FIG. 4 shows a cross-sectional view of the inprocess wafer portion of FIG. 3 after oxide spacer formation and deposition of amorphous silicon.

Referring now to FIG. 4, photoresist 32 (seen is FIG. 3) has been removed. Next, amorphous polysilicon is deposited thereby making contact to diffusion (or source/drain) region 11 at buried contact opening 33. Photoresist 43 is then placed and patterned to define the channel region of the TFT after a subsequent etch.

Figure 5:
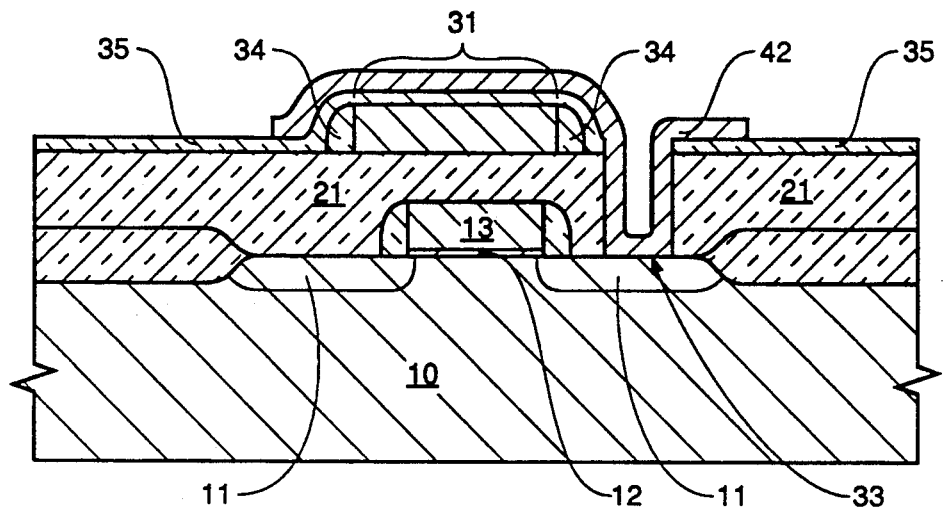
FIG. 5 show a cross-sectional view of the in-process wafer portion of FIG. 6, after patterning of the TFT silicon channel.

Referring now to FIG. 5, photoresist 43 (seen in FIG. 4) has been stripped thereby revealing amorphous poly 42 as the channel region for the TFT.

Figure 6:
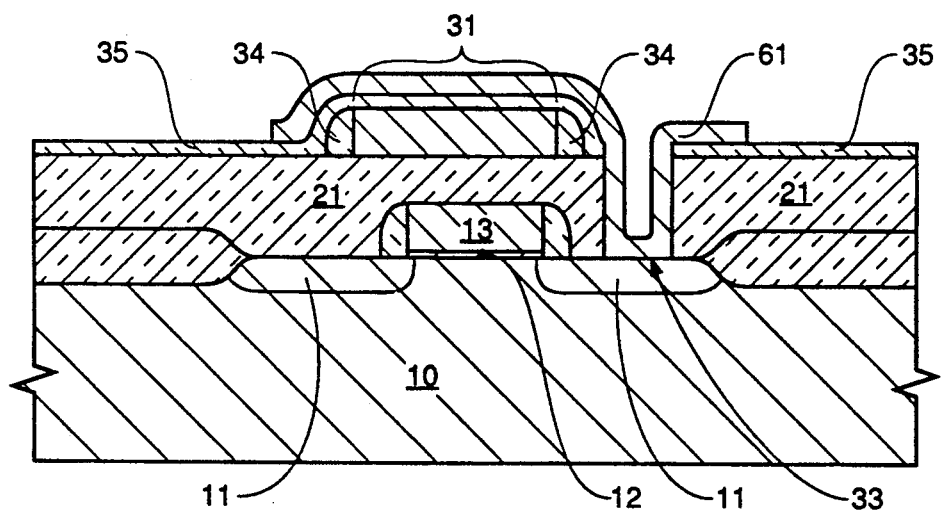
FIG. 6 show a cross-sectional view of the in-process wafer portion of FIG. 5, after epitaxial regrowth starting at the substrate silicon and continuing through the amorphous silicon to complete the TFT structure of the present invention.

Referring now to FIG. 6, epitaxial regrowth of crystalline structure of silicon substrate 10 (doped to an n-type diffusion region 11) is promoted by subjecting the wafer to an annealing step at a temperature range of 500°–700° C. for 15 minutes to a few hours (approximately 6 hours). The epitaxial regrowth at the silicon substrate continues into amorphous silicon 61 until the entire channel structure 61 is transformed into a single crystalline structure 61 and selected source/drain regions are doped to a p-type conductivity to complete the TFT of the present invention. Several preferred doping techniques of the selected source/drain regions include in-situ doping and ion implantation. From this point on the silicon wafer is completed using conventional process steps.

As one skilled in the art would readily recognize, the conductivity types selected for doping the substrate and forming the active devices may be reversed to create an NMOS TFT device overlying and aligned to an active PMOS device if so desired.

Therefore, it is to be understood that although the present invention has been described with reference to first and second embodiments, various modifications, known to those skilled in the art, may be made to the structure and process steps presented herein without departing from the invention as recited in the several claims appended hereto.

We claim:

1. A process for forming an active load in an integrated circuit fabricated on a single crystalline substrate, said process comprising:
   (a) forming a first dielectric layer superjacent existing surface of said single crystalline substrate;
   (b) planarizing said first dielectric layer;
   (c) forming a first semiconductive layer superjacent said planarized first dielectric layer;
   (d) patterning and etching said first semiconductive layer thereby forming a gate terminal to an active device;
   (e) forming dielectric spacers adjacent said patterned edges of said first semiconductive layer;
   (f) forming a second dielectric layer superjacent and coextensive to wafer surface resulting from step "e";
   (g) patterning and etching a buried contact location thereby exposing portions of said single crystalline substrate;
   (h) forming a second semiconductive layer superjacent existing wafer surface resulting from step "g", said second semiconductive layer thereby making physical contact to said exposed portions of single crystalline substrate;
   (i) patterning and etching said second semiconductive material thereby forming a channel region for said active device and
   (j) growing a crystalline structure throughout said patterned second semiconductive material by using said single crystalline substrate as a seed source, said active device serving as said active load.

2. The process of claim 1, wherein said forming of said first semiconductive layer is by deposition and doping of polysilicon.

3. The process of claim 1, wherein said forming of said second dielectric layer is by low pressure chemical vapor deposition of oxide.

4. The process of claim 1, wherein said forming of said second dielectric layer is by low pressure chemical vapor deposition of a combination of oxide and nitride.

5. The process of claim 1, wherein said forming of said second semiconductive layer is by deposition and doping of amorphous polysilicon.

6. The process of claim 5, wherein said doping of said second semiconductive layer is by in-situ doping.

7. The process of claim 5, wherein said doping of said second semiconductive layer is by ion implantation.

8. The process of claim 1, wherein said forming of said crystalline material is by epitaxial regrowth of amorphous silicon throughout said second semiconductive layer by annealing, wherein said single crystalline substrate seed source is a silicon seed source and said second semiconductive layer is amorphous silicon.

9. The process of claim 8, wherein said annealing step comprises heating existing material on said substrate at a temperature range between 500° to 700° C. for approximately 15 minutes to 6 hours.

10. A process for forming a p-channel thin film transistor in an integrated circuit fabricated on a single crystalline silicon substrate, said process comprising:
   (a) depositing a first oxide layer superjacent existing surface of said single crystalline silicon substrate;
   (b) planarizing said first oxide layer;
   (c) depositing a first polysilicon layer superjacent said planarized first oxide layer;
   (d) patterning and etching said first polysilicon layer thereby forming a gate terminal to said thin film transistor;
   (e) depositing and etching oxide spacers adjacent said patterned edges of said first polysilicon layer;
   (f) forming a second dielectric layer superjacent and coextensive existing substrate surface resulting from step "e";
   (g) patterning and etching a buried contact location thereby exposing portions of said single crystalline silicon substrate;
   (h) depositing a layer of amorphous silicon superjacent existing substrate surface resulting from step "g", said amorphous silicon layer thereby making physical contact to said exposed portions of single crystalline silicon substrate;
   (i) patterning and etching said amorphous silicon layer thereby forming a channel region for said thin film transistor; and
   (j) growing epitaxial silicon throughout said patterned amorphous silicon by using said single crystalline silicon substrate as a seed source by annealing existing material on said substrate at a temperature range between 500° to 700° C. for approximately 15 minutes to 6 hours.

* * * * *